(12) United States Patent
Kim (10) Patent No.: US 11,281,385 B2
(45) Date of Patent: Mar. 22, 2022

(54) MEMORY CONTROLLER AND MEMORY SYSTEM

(71) Applicant: SK hynix Inc., Gyeonggi-do (KR)

(72) Inventor: Jung Ae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 248 days.

(21) Appl. No.: 15/980,389

(22) Filed: May 15, 2018

(65) Prior Publication Data

US 2019/0114104 A1 Apr. 18, 2019

(30) Foreign Application Priority Data

Oct. 13, 2017 (KR) ........................ 10-2017-0133234

(51) Int. Cl.
| | | |
|---|---|---|
| *G06F 12/00* | (2006.01) | |
| *G06F 3/06* | (2006.01) | |
| *G11C 17/16* | (2006.01) | |
| *H01L 27/115* | (2017.01) | |
| *G11C 16/04* | (2006.01) | |
| *H01L 27/11556* | (2017.01) | |
| *H01L 27/11582* | (2017.01) | |

(52) U.S. Cl.
CPC .......... *G06F 3/0632* (2013.01); *G06F 3/0604* (2013.01); *G06F 3/0673* (2013.01); *G11C 16/0483* (2013.01); *G11C 17/16* (2013.01); *H01L 27/115* (2013.01); *H01L 27/11556* (2013.01); *H01L 27/11582* (2013.01)

(58) Field of Classification Search
CPC .... G06F 3/0604; G06F 3/0632; G06F 3/0673; G06F 9/4401; G11C 16/0483; G11C 17/16; H01L 27/115; H01L 27/11556; H01L 27/11582
See application file for complete search history.

(56) References Cited

U.S. PATENT DOCUMENTS

| | | | | |
|---|---|---|---|---|
| 6,990,387 | B1 * | 1/2006 | Freij ................ | G01R 31/31718 380/1 |
| 2005/0228980 | A1 * | 10/2005 | Brokish ............... | G06F 21/575 713/2 |
| 2012/0137049 | A1 * | 5/2012 | Mollichelli ............... | G06F 8/66 711/103 |
| 2014/0059278 | A1 * | 2/2014 | Schuh .................... | G11C 29/26 711/103 |
| 2015/0301754 | A1 * | 10/2015 | Kochar ................ | G06F 3/0679 711/103 |

FOREIGN PATENT DOCUMENTS

| | | |
|---|---|---|
| KR | 100807936 | 2/2008 |
| KR | 1020140146876 | 12/2014 |

* cited by examiner

*Primary Examiner* — Gurtej Bansal
(74) *Attorney, Agent, or Firm* — IP &T Group LLP (57) ABSTRACT

A memory controller includes a read only memory (ROM) suitable for outputting a ROM code to execute firmware in response to fuse data and a control processor suitable for executing the firmware in response to the ROM code. A memory system includes the memory controller and a storage device storing data.

13 Claims, 8 Drawing Sheets

MEMORY CONTROLLER AND MEMORY SYSTEM

CROSS-REFERENCE TO RELATED APPLICATION

The present application claims priority under 35 U.S.C. § 119(a) to Korean patent application number 10-2017-0133234, filed on Oct. 13, 2017, which is incorporated herein by reference in its entirety.

BACKGROUND

Field of Invention

The present disclosure relates generally to a memory controller for a memory system. More particularly, the present disclosure relates to a memory controller for a memory system that is capable of controlling a ROM code, and to the memory system employing the memory controller.

Description of Related Art

A memory system typically includes a storage device (also referred to often as a memory device) and a memory controller operatively coupled to the memory device for controlling the storage device.

The storage device may include a plurality of memory devices. The memory devices may store data or output stored data under the control of the memory controller. For example, the memory devices may comprise volatile memory devices which lose stored data in the absence of a power supply or non-volatile memory devices which retain stored data even in the absence of a power supply.

The memory controller may control data communication between a host and the storage device.

The host may communicate with the memory devices through the memory controller using various interface protocols such as peripheral component interconnect-express (PCI-E), advanced technology attachment (ATA), serial ATA (SATA), parallel ATA (PATA), serial attached SCSI (SAS), universal serial bus (USB), multi-media card (MMC), enhanced small disk interface (ESDI), or integrated drive electronics (IDE).

SUMMARY

Various embodiments of the present invention relate generally to a memory controller for a memory system and to a memory system employing the memory controller.

According to an embodiment of the present invention a memory controller for a memory system is provided that is capable of operating various storage devices by controlling fuse data and a memory system having the same.

According to an embodiment, a memory controller may include a read only memory (ROM) suitable for outputting a ROM code to execute firmware in response to fuse data; and a control processor suitable for executing the firmware in response to the ROM code.

According to an embodiment, a storage device suitable for storing data; and a memory controller suitable for generating a ROM code to execute various types of firmware depending on a fuse setting and for executing the firmware depending on the ROM code.

According to an embodiment, a memory device; a read only memory (ROM) suitable for storing ROM code; and a control processor suitable for executing firmware according to the ROM code thereby controlling the memory device, wherein the ROM provides the control processor with the ROM code through fuse data dependent upon the memory device and set by an e-fuse.

These and other features and advantages of the present invention will become apparent to those with ordinary skill in the art to which the present invention belongs from the following description in conjunction with the accompanying drawings.

DETAILED DESCRIPTION

Hereinafter, various exemplary embodiments will be described in detail with reference to the accompanying drawings. The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

It is also noted that in this specification, "connected/coupled" refers to one component not only "directly coupling" another component but also "indirectly coupling" another component through an intermediate component. In addition, throughout the specification, when it is said that a certain part "includes" a certain element, this does not exclude other elements from being included but the certain part may further include another element unless particularly described otherwise.

In describing the present invention, detailed description of known methods and features is purposefully omitted in order to avoid obscuring the disclosure of the present invention.

We further note that the terms first and second may be used herein to describe various components, however, we emphasize that the components are not limited by these terms, and that these terms are used only to distinguish one component from another component.

Also, we note that the terminology used herein is for the purpose of describing particular embodiments only and is not intended limit the scope of the present invention. Furthermore, according to standard patent drafting practice, a singular recitation of an element is intended to include multiple such elements as well, unless the context clearly indicates otherwise.

It is further understood that the terms "comprises", "comprising", "includes", and "including" when used in this specification, specify the presence of a stated element and do not preclude the presence or addition of one or more other elements. Also, as used herein, the terms "and/or" and "at least one of a list of items" are used interchangeably to include any and all combinations of one or more of the associated listed items.

In the following description, numerous specific details are set forth in order to provide a thorough understanding of the present invention. However, at is should be understood by the skilled person having ordinary skill in the art of the present invention, the present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
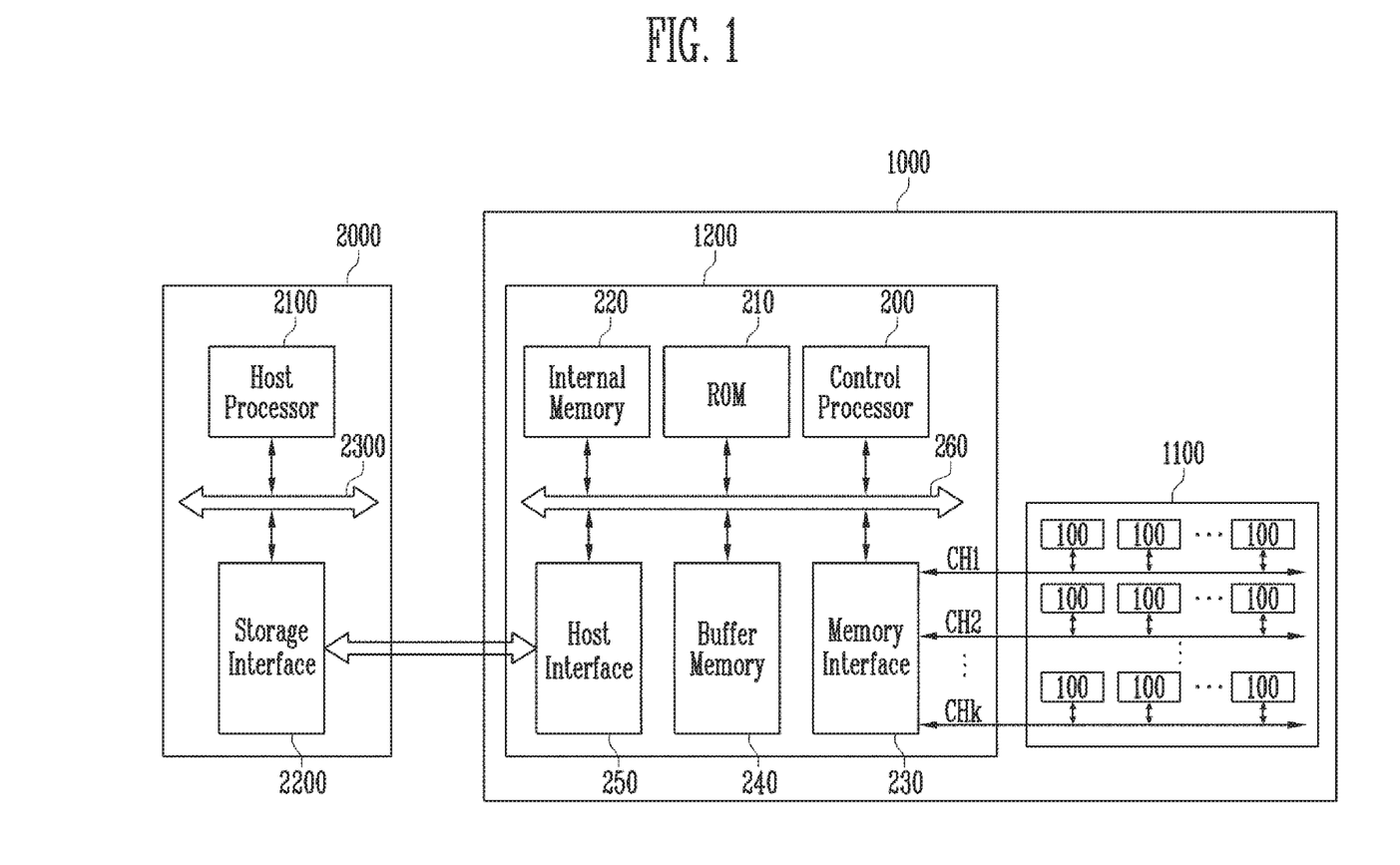
FIG. 1 is a diagram illustrating a memory system according to an embodiment of the present invention.

FIG. 1 is a diagram illustrating a memory system 1000 according to an embodiment of the present invention.

Referring to FIG. 1, the memory system 1000 may include a storage device 1100 for storing data, a host 2000, and a memory controller 1200 operatively coupled to the host 2000 and the storage device 1100 for controlling communications between the storage device 1100 and the host 2000.

The storage device 1100 may include a plurality of memory devices 100. For example, the memory devices 100 may be volatile memory devices which lose stored data in the absence of power supply or non-volatile memory devices which retain stored data even in the absence of power supply. In FIG. 1, the memory devices 100 are illustrated as non-volatile memory devices according to an exemplary embodiment. For example, the non-volatile memory devices 100 may be FLASH memory devices.

The memory devices 100 may be coupled to the controller 1200 via a plurality of channels CH1 to CHk. One or more memory devices 100 may be coupled to the controller via each of the channels CH1 to CHk as illustrated in FIG. 1.

The memory controller 1200 may include a control processor 200, a read only memory (ROM) 210, an internal memory 220, a memory interface 230, a buffer memory 240, and a host interface 250.

The control processor 200 may perform various operations for controlling the storage device 1100 and/or generate a command and an address. For example, the control processor 200 may check the status of the storage device 1100 by generating a status check command for a status check operation. In accordance with the result of the status check operation of the storage device 1100, the control processor 200 may generate a command to control the storage device 1100. The control processor 200 may execute firmware according to a ROM code output from the ROM 210.

The ROM 210 may be a non-volatile read only memory which retains stored data even when the power supply to the ROM is interrupted or turned off, i.e., even in the absence of a power supply. A plurality of fuse data and a plurality of ROM codes may be stored in the ROM 210. According to an embodiment, when an enable signal or power is provided to the ROM 210, fuse data may be selected among the fuse data and may be outputted from the ROM. Then, a ROM code among the ROM codes may be selected and may be outputted by the selected fuse data. The ROM codes may include a plurality of codes to execute the firmware, and it may be very difficult to modify the ROM codes after packaging. The fuse data may include a variety of information regarding the storage devices which the memory controller 1200 may support. For example, the fuse data may include a wafer number, a lot number, a packaging date, and firmware information. Further, the fuse data may be stored by a fuse control method dependent on the storage device 1100 that the memory controller 1200 supports. Therefore, when the selected fuse data is output in response to the set fuse, the ROM code to execute the firmware may be outputted in response to the firmware information included in the output fuse data.

The internal memory 220 may store a variety of information necessary to the operation of the memory controller 1200. For example, the internal memory 220 may include logical and/or physical address map tables. According to an address map table, when a logical address is inputted to the internal memory 220, a physical address corresponding to the inputted logical address may be outputted. Further, when a physical address is inputted to the internal memory 220, a logical address corresponding to the inputted physical address may be outputted. For example, the logical address may be outputted from the host 2000 and may be inputted to the internal memory 220, and the physical address may be outputted from the storage device 1100 and may be inputted to the internal memory 220. The internal memory 220 may include at least one of a random-access memory (RAM), a dynamic RAM (DRAM), a static RAM (SRAM), a cache, and a tightly coupled memory (TCM).

The memory interface 230 may exchange commands, addresses, and data between the memory controller 1200 and the storage device 1100. For example, the memory interface 230 may transmit a command, an address, and data to one or more of the memory devices 100 through one or more of the first to $k^{th}$ channels CH1 to CHk, and may receive the data from one or more of the memory devices 100. Also, the command may be an internal command and an address may be a logical address.

The buffer memory 240 may temporarily store the data exchanged between the storage device 1100 and the host 2000 when the memory system 1000 performs an operation. For example, during a program operation, the buffer memory 240 may temporarily store original program data until the program operation of a selected memory device 100 passes. Alternatively, during a read operation, the buffer memory 240 may temporarily store data read from the memory device 100 and sequentially transmit the data to the host interface 250. For example, the buffer memory 240 may be an SRAM or a DRAM.

The host interface 250 may exchange commands, addresses, and data between the memory controller 1200 and the host 2000. For example, the host interface 250 may receive a command, an address, and data from the host 2000 and may transmit the data to the host 2000. The command may be an external command. The address may be a physical address.

The control processor 200, the ROM 210, the internal memory 220, the memory interface 230, the buffer memory 240, and the host interface 250 may communicate with one another through a bus 260. Any suitable bus may be employed.

The host 2000 may include a host processor 2100 and a storage interface 2200. The host processor 2100 and the storage interface 2200 may communicate with each other through a bus 2300. Any suitable bus may be employed.

The host processor 2100 may generate a program request to control a program operation of the memory system 1000, or a read request to control a read operation of the memory system 1000. For example, the program request may include an external program command, a physical address to be transmitted to the memory system 1000 and corresponding data to be stored into the storage device 1100. For example, the read request may include an external read command and a physical address to be transmitted to the memory system 1000. In addition, the host processor 2100 may control various operation requests such as an erase request.

The storage interface 2200 may communicate with the memory system 1000 by using any suitable interface protocol such as a peripheral component interconnect express (PCIe), an advanced technology attachment (ATA), a serial ATA (SATA), a parallel ATA (PATA), a serial attached SCSI (SAS), and a non-volatile memory express (NVMe). The storage interface 2200 may include various interfaces such as a universal serial bus (USB), a multi-media card (MMC), an enhanced small disk interface (ESDI), and integrated drive electronics (IDE), and may not be limited to the above examples.

Figure 2:
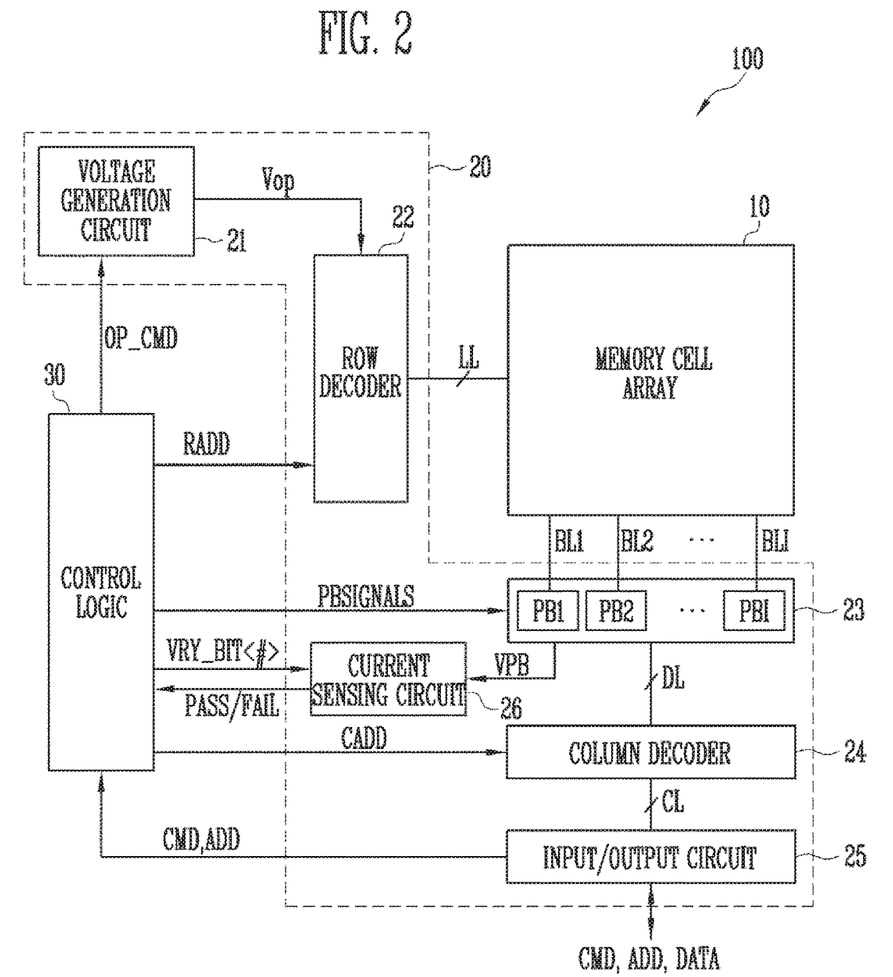
FIG. 2 is a detailed diagram illustrating an exemplary configuration of a memory device shown in FIG. 1.

FIG. 2 is a detailed diagram illustrating an exemplary configuration of the memory device 100 shown in FIG. 1.

Referring to FIG. 2, the memory device 100 may include a memory cell array 10 for storing data. The memory device 100 may include peripheral circuits 20 configured to perform operations such as a program operation to store data in the memory cell array 10, a read operation to output the stored data, and an erase operation to erase the stored data. The memory device 100 may include a control logic 30 for controlling the peripheral circuits 20 in response to the supervisory control of the memory controller 1200 of FIG. 1.

The memory cell array 10 may include a plurality of memory blocks. User data and a variety of information necessary to operate the memory device 100 such as metadata may be stored in the memory blocks. The memory blocks may have a two-dimensional or three-dimensional structure.

The peripheral circuits 20 may perform program, read and erase operations in response to control of the control logic 30. For example, the peripheral circuits 20 may include a voltage generation circuit 21, a row decoder 22, a page buffer group 23, a column decoder 24, an input/output circuit 25, and a current sensing circuit 26.

The voltage generation circuit 21 may generate various operating voltages Vop which are used for program, read and erase operations in response to an operation status read command OP_CMD. For example, the voltage generation circuit 21 may generate a program voltage, a verification voltage, a pass voltage, a compensation program voltage, a read voltage, an erase voltage, and a turn-on voltage according to the control of the control logic 30.

The row decoder 22 may transmit the operating voltages Vop in response to a row address RADD, to local lines LL coupled to a selected memory block among the memory blocks of the memory cell array 10. The local lines LL may include local word lines, local drain select lines, and local source select lines. In addition, the local lines LL may include various lines coupled to the memory blocks, for example, a source line.

The page buffer group 23 may be coupled to bit lines BL1 to BLI which are coupled to the memory blocks of the memory cell array 10. The page buffer group 23 may include a plurality of page buffers PB1 to PBI coupled to the bit lines BL1 to BLI. The page buffers PB1 to PBI may operate in response to page buffer control signals PBSIGNALS. For example, the page buffers PB1 to PBI may temporarily store data received through the bit lines BL1 to BLI or may perform sensing a voltage or a current of the bit lines BL1 to BLI during a read or verify operation.

The column decoder 24 may transmit data between the input/output circuit 25 and the page buffer group 23 in response to a column address CADD. For example, the column decoder 24 may exchange data with the page buffers PB through data lines DL or may exchange data with the input/output circuit 25 through column lines CL.

The input/output circuit 25 may transmit a command CMD and an address ADD received from the memory controller 1200 of FIG. 1 to the control logic 30 or may exchange data DATA with the column decoder 24.

The current sensing circuit 26 may generate a reference current in response to an allowable bit VRY_BIT<#> during a read or verify operation and may output a pass signal PASS or a fail signal FAIL by comparing a sensing voltage VPB received from the page buffer group 23 with the reference voltage generated by the reference current.

The control logic 30 may control the peripheral circuits 20 by outputting the operation status read command OP_CMD, the row address RADD, the page buffer control signals PBSIGNALS, and the allowable bit VRY_BIT<#> in response to the command CMD and the address ADD. In addition, the control logic 30 may determine whether a verify operation passes or fails in response to the pass signal PASS or the fail signal FAIL.

Figure 3:
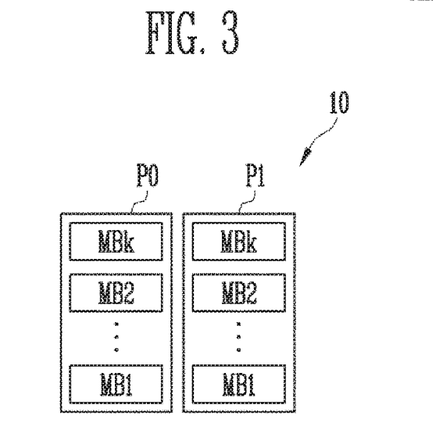
FIG. 3 is a diagram illustrating an exemplary configuration of a memory cell array shown in FIG. 2.

FIG. 3 is a diagram illustrating an exemplary configuration of the memory cell array 10 shown in FIG. 2.

Referring to FIG. 3, the memory cell array 10 may include planes P0 and P1. It should be understood, that although in FIG. 3, only two planes P0 and P1 are illustrated, only a single plane or three or more planes may be included in the memory cell array 10 depending on the memory device 100.

Each of the planes P0 and P1 may include a plurality of memory blocks MB1 to MBk. The memory blocks MB1 to MBk may include a plurality of memory cells for storing data and may have a two-dimensional or three-dimensional structure.

Figure 4:
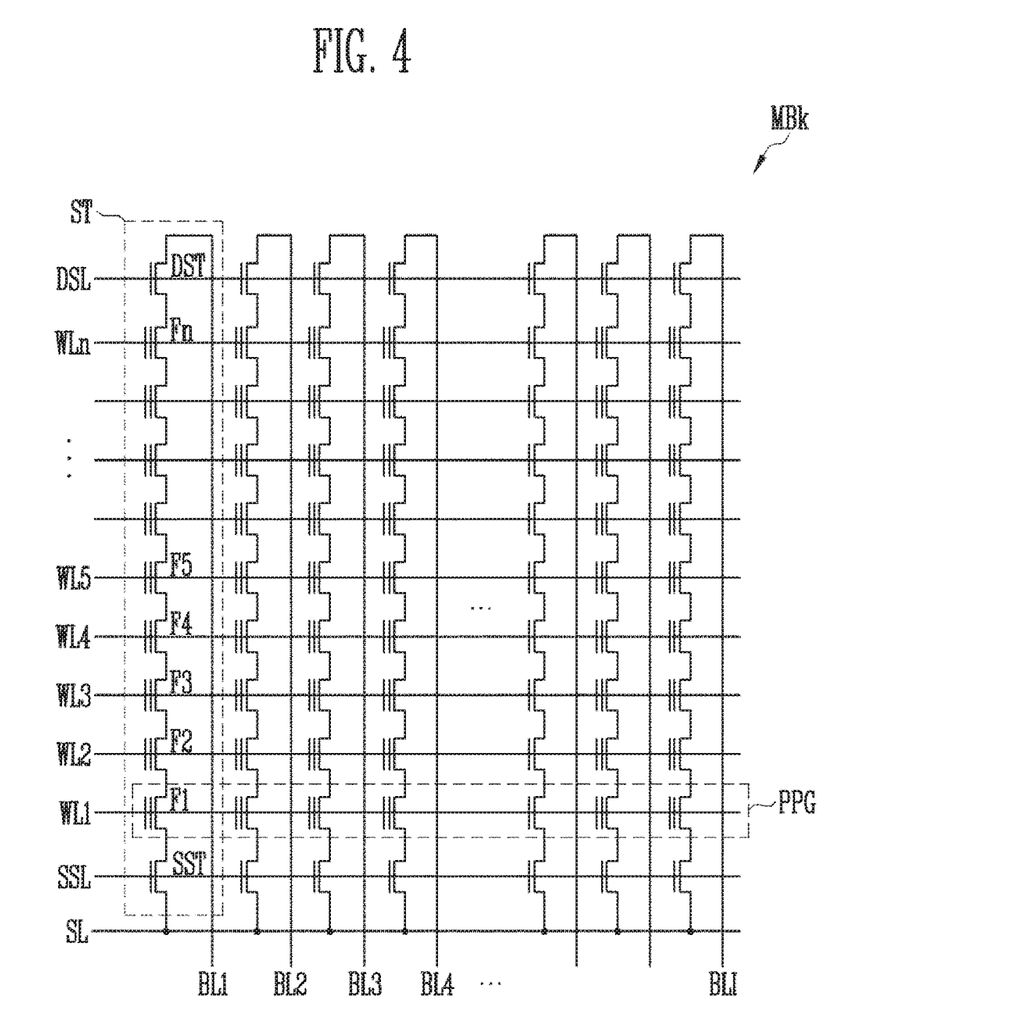
FIG. 4 is a circuit diagram illustrating an exemplary configuration of a memory block shown in FIG. 3.

FIG. 4 is a circuit diagram illustrating an exemplary configuration of the memory block MBk shown in FIG. 3.

Referring to FIG. 4, the plurality of memory blocks MB1 to MBk illustrated in FIG. 3 may have the same configuration as one another, hence, only one of the plurality of memory blocks MBk is described herein in more detail as an example.

The memory block MBk may include a plurality of cell strings ST coupled between the bit lines BL1 to BLI and a source line SL. For example, the cell strings ST may be coupled to the bit lines BL1 to BLI, respectively, and may be coupled in common to the source line SL. Since the cell strings ST may have similar configurations to one another, a detailed description will be made taking the cell string ST coupled to the first bit line BL1 as an example.

The cell string ST may include a source select transistor SST, first to $n^{th}$ memory cells F1 to Fn (n is a positive integer) and a drain select transistor DST coupled in series between the source line SL and the first bit line BL1. The number of source select transistors SST and the number of drain select transistors DST may not be limited to the numbers illustrated in FIG. 4. The source select transistor SST may be coupled between the source line SL and the first memory cell F1. The first to $n^{th}$ memory cells F1 to Fn may be coupled in series between the source select transistor SST and the drain select transistor DST. The drain select transistor DST may be coupled between the $n^{th}$ memory cell Fn and the first bit line BL1. Although it is not illustrated in FIG. 4, dummy cells may be further coupled between the memory cells F1 to Fn or between the source select transistor SST and the drain select transistor DST.

Gates of the source select transistors SST included in different cell strings ST may be coupled to a source select line SSL, gates of the first to $n^{th}$ memory cells F1 to Fn may be coupled to first to $n^{th}$ word lines WL1 to WLn, and gates of the drain select transistors DST may be coupled to drain select lines DSL. A group of memory cells coupled to each of the word lines WL1 to WLn may be referred to as a page PPG. For example, among the memory cells F1 to Fn included in different cell strings ST, the group of the first memory cells F1 coupled to the first word line WL1 may be one page PPG. The program and read operations may each be performed on a page PPG unit basis.

Figure 5:
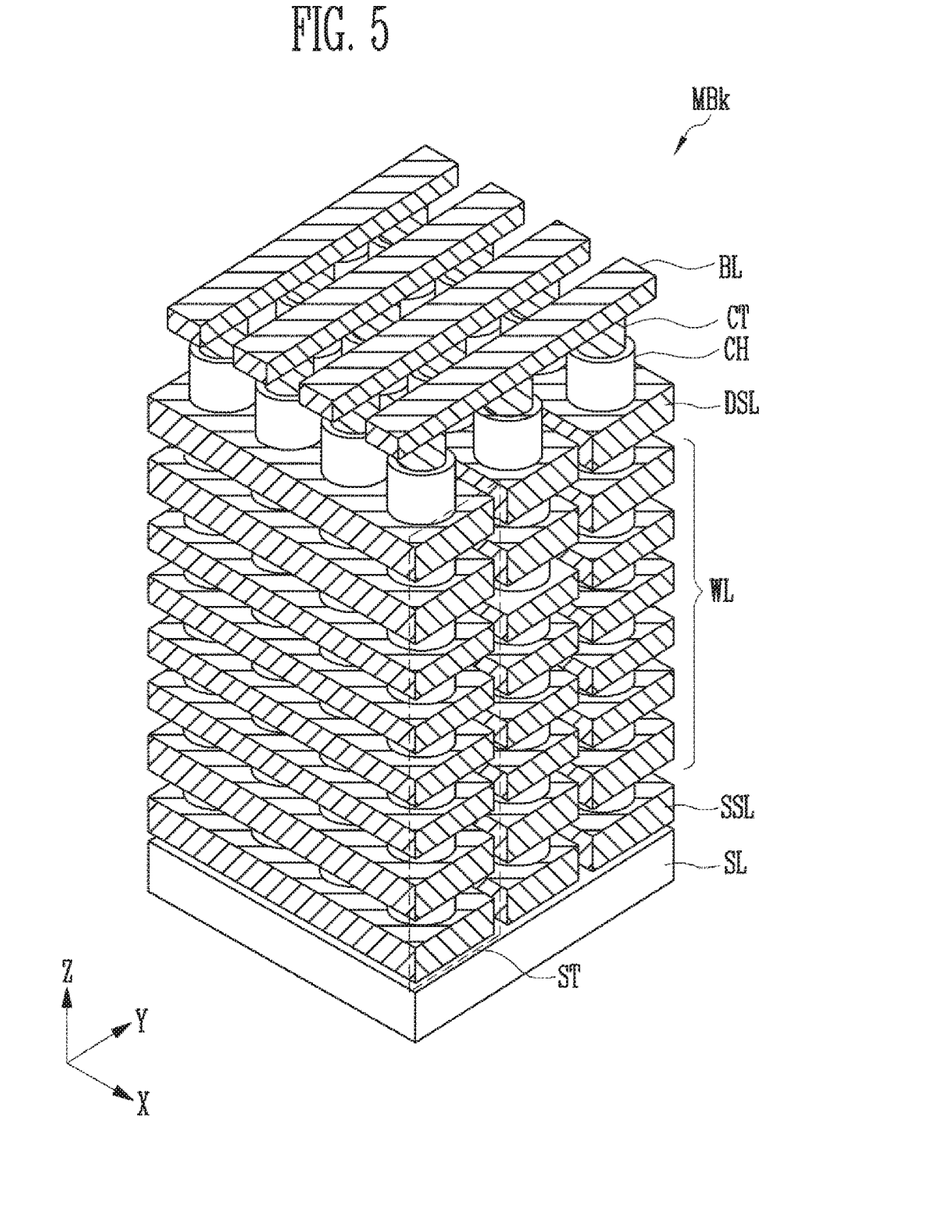
FIG. 5 is a diagram illustrating an embodiment of the memory block of FIG. 3 having a three-dimensional structure.

FIG. 5 is a diagram illustrating a perspective view of an embodiment of the memory block MBk of FIG. 3 having a three-dimensional structure.

Referring to FIG. 5, the memory block MBk having the three-dimensional structure may be formed in an I shape in a vertical direction (the Z direction) to a substrate, and may include a plurality of cell strings ST arranged between bit lines BL and the source line SL. Alternatively, wells may be included instead of the source line SL. This structure may be called a bit cost scalable (BiCS) structure. For example, when the source line SL is formed in the horizontal direction over an upper part of the substrate, the cell strings ST having the BiCS structure may be formed in the vertical direction (the Z direction) to an upper part of the source line SL.

More specifically, the cell strings ST may be arranged in a first direction (the X direction) and a second direction (the Y direction). The cell strings ST may include the source select lines SSL, the word lines WL, and the drain select lines DSL separately stacked on one another. The numbers of source select lines SSL, the numbers of word lines WL, and the numbers of drain select lines DSL may not be limited to the numbers illustrated in FIG. 5 and may change depending on the memory device 100. The cell strings ST may include vertical channel layers CH vertically passing through the source select lines SSL, the word lines WL, and the drain select lines DSL. The cell strings ST may also include the bit lines BL extended in the second direction (the Y direction) and contacting upper parts of the vertical channel layers CH protruding from upper parts of the drain select lines DSL. Memory cells may be formed between the word lines WL and the vertical channel layers CH. A contact plug CT may be further formed between the bit lines BL and the vertical channel layers CH.

Figure 6:
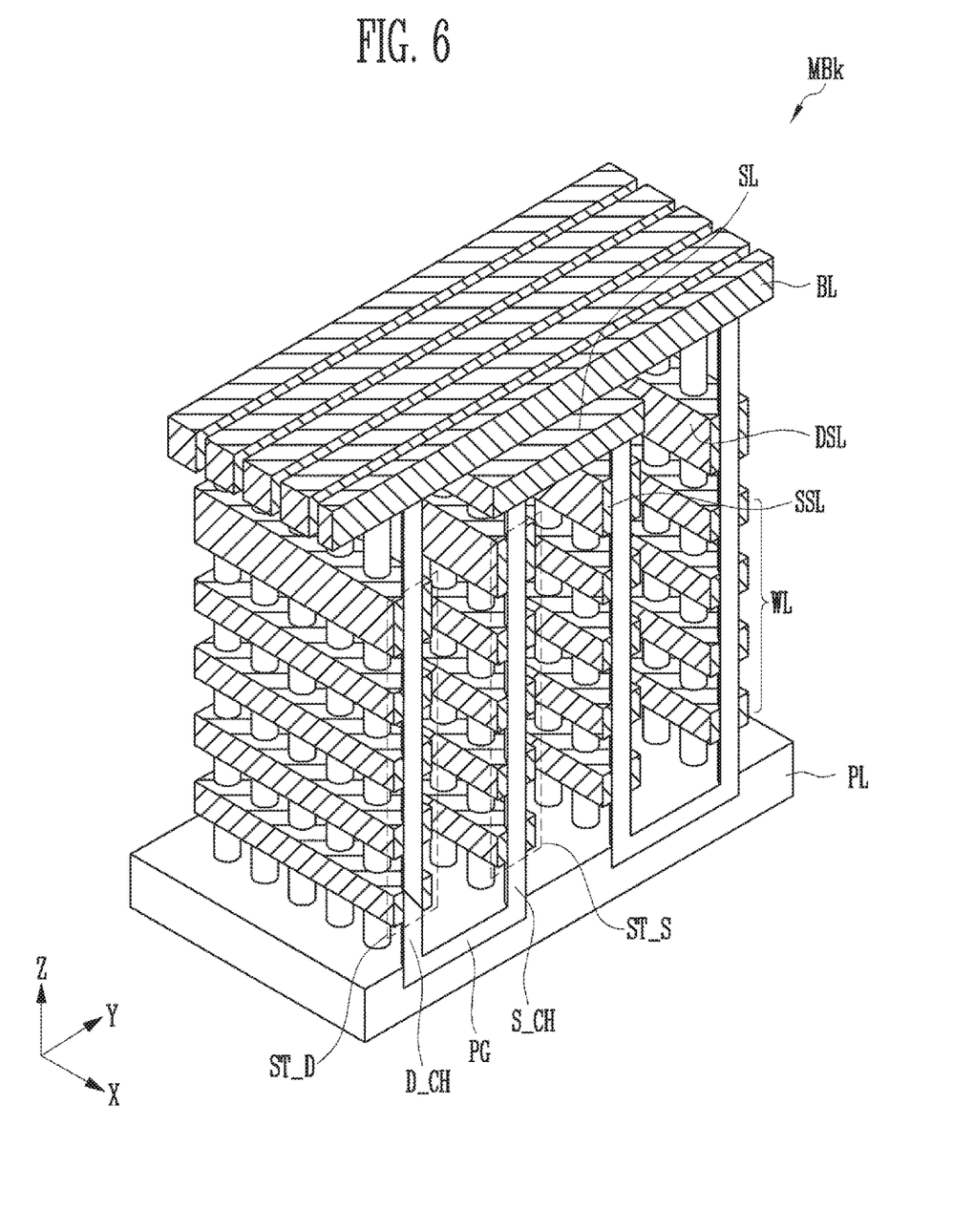
FIG. 6 is a diagram illustrating another embodiment of the memory block of FIG. 3 having a three-dimensional structure.

FIG. 6 is a diagram illustrating another embodiment of the memory block MBk of FIG. 3 having a three-dimensional structure.

Referring to FIG. 6, the memory block MBk having the three-dimensional structure may be formed in a U shape in a vertical direction (the Z direction) to a substrate, and may include source strings ST_S and drain strings ST_D paired with each other and coupled between the bit lines BL and the source line SL. The source strings ST_S and the drain strings ST_D may be coupled to each other by a pipe gate PG and may form a U-shaped structure. A pipe line PL may include the pipe gate PG. More specifically, the source strings ST_S may be formed vertically between the source line SL and the pipe line PL. The drain strings ST_D may be formed vertically between the bit lines BL and the pipe line PL. This structure may be called a pipe-shaped bit cost scalable (P-BiCS) structure.

More specifically, the drain strings ST_D and the source strings ST_S may be arranged in a first direction (the X direction) and a second direction (the Y direction), and may be arranged alternately with each other along the second direction (the Y direction). The drain strings ST_D may include the word lines WL and the drain select lines DSL separately stacked on each other, and drain vertical channel layers D_CH vertically passing through the word lines WL and the drain select lines DSL. The source strings ST_S may include the word lines WL and the source select lines SSL separately stacked on each other, and source vertical channel layers S_CH vertically passing through the word lines WL and the source select lines SSL. The drain vertical channel layers D_CH and the source vertical channel layers S_CH may be coupled to each other in the pipe line PL by the pipe gate PG. The bit lines BL may contact upper parts of the drain vertical channel layers D_CH protruding from upper parts of the drain select lines DSL and may be extended in the second direction (the Y direction).

The memory block MBk may be embodied in various structures in addition to the structures described in FIGS. 4 to 6.

Figure 7:
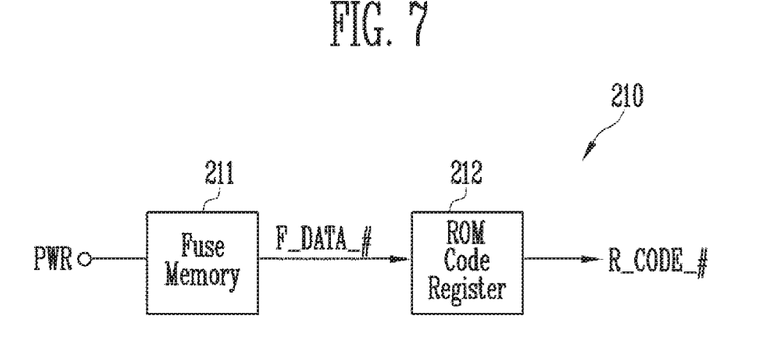
FIG. 7 is a detailed diagram illustrating an exemplary configuration of a ROM shown in FIG. 1.

FIG. 7 is a detailed diagram illustrating an exemplary configuration of the ROM 210 shown in FIG. 1.

Referring to FIG. 7, the ROM 210 may include a fuse memory 211 and a ROM code register 212.

The fuse memory 211 may store a plurality of fuse data including a variety of information of the storage devices supported by the memory controller 1200 and may output selected fuse data F_DATA_# according to a set fuse when a voltage PWR is provided to the ROM 210. For this, an e-fuse may be used as a fuse. For example, fuse data may be set up according to a set e-fuse. The e-fuse may be set at the packaging step depending on the storage devices.

The ROM code register 212 may store a plurality of ROM codes to execute firmware. For example, a ROM code may include firmware information to execute the firmware. The ROM code register 212 may output a selected ROM code R_CODE_# in response to the fuse data F_DATA_#.

The fuse data F_DATA_# may be described more specifically as below.

Figure 8:
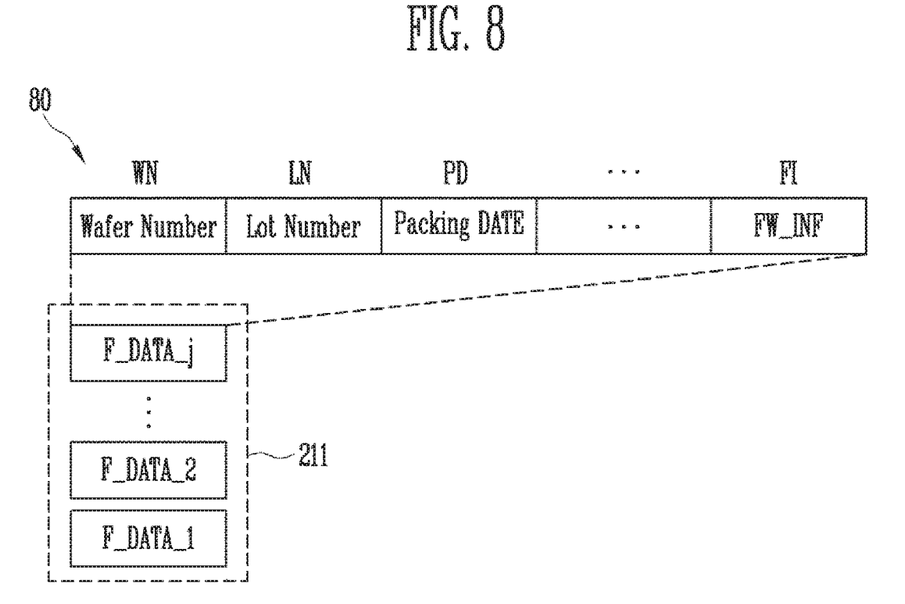
FIG. 8 is a detailed diagram illustrating an exemplary configuration of a fuse memory shown in FIG. 7.

FIG. 8 is a detailed diagram illustrating the fuse memory 211 of FIG. 7.

Referring to FIG. 8, the fuse memory 211 may include first to $j^{th}$ fuse data F_DATA_1 to F_DATA_j. Each (denoted with numeral "80" in FIG. 8) of the first to $j^{th}$ fuse data F_DATA_1 to F_DATA_j may include a variety of information relating to the storage devices and firmware information. This information may vary depending on the storage devices and the memory systems, and may further include a variety of information depending on a manufacturer.

Each of the first to $j^{th}$ fuse data F_DATA_1 to F_DATA_j may include A bytes of data (A is a positive integer). For example, each of the first to $j^{th}$ fuse data F_DATA_1 to F_DATA_j may store a wafer number WN, a lot number LN, and a packaging date PD as well as firmware information (denoted as "FW_INF" in FIG. 8) FI. Therefore, each of the first to $j^{th}$ fuse data F_DATA_1 to F_DATA_j may store different information. For example, the ROM code register 212 of FIG. 7 may output the ROM code R_CODE_# to operate the firmware in accordance with firmware information FI of the selected fuse data F_DATA_# among the first to $j^{th}$ fuse data F_DATA_1 to F_DATA_j.

Conventionally, when a ROM code is to be modified, for example, when a storage device is changed, a complicated revision process, such as modifying an electrical wiring of a circuit, is required, and it also takes a long time.

However, according to an embodiment, a ROM code may be selectively outputted by setting a fuse and thus a fuse change may replace the conventional ROM code revision process, which may simplify the revision steps and shorten the revision time.

Figure 9:
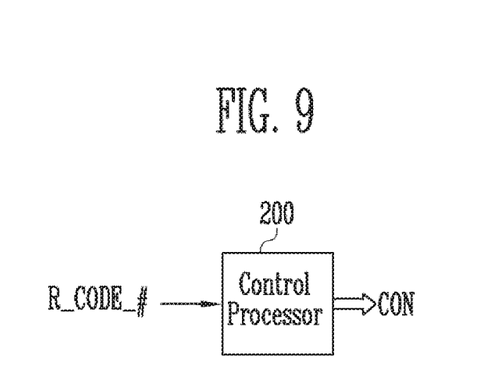
FIG. 9 is a detailed diagram illustrating an exemplary configuration of a control processor shown in FIG. 1.

FIG. 9 is a detailed diagram illustrating the control processor 200 of FIG. 1.

Referring to FIG. 9, the control processor 200 may execute firmware in accordance with the ROM code R_CODE_# outputted from the ROM 210. The control processor 200 may execute the firmware by outputting control signals CON in accordance with the ROM code R_CODE_#. The ROM code R_CODE_# and the control signals CON may be transmitted through the bus 260 of FIG. 1.

The firmware may be executed differently depending on the storage devices and may be executed selectively in accordance with the ROM code R_CODE_#. The control processor 200 may manage the storage devices by different methods depending on the firmware.

For example, the control processor 200 may improve reliability of the storage devices by using various error correction methods depending on the firmware. For example, an error correction operation may be performed by using a low-density parity check (LDPC) code. The LDPC code may be decoded by using an iterative decoding algorithm based on a sum-product algorithm on a factor graph. An LDCP code rate may vary depending on the firmware. In addition to managing the LDPC code rate, the firmware may manage reliability of operations performed in the storage devices.

Figure 10:
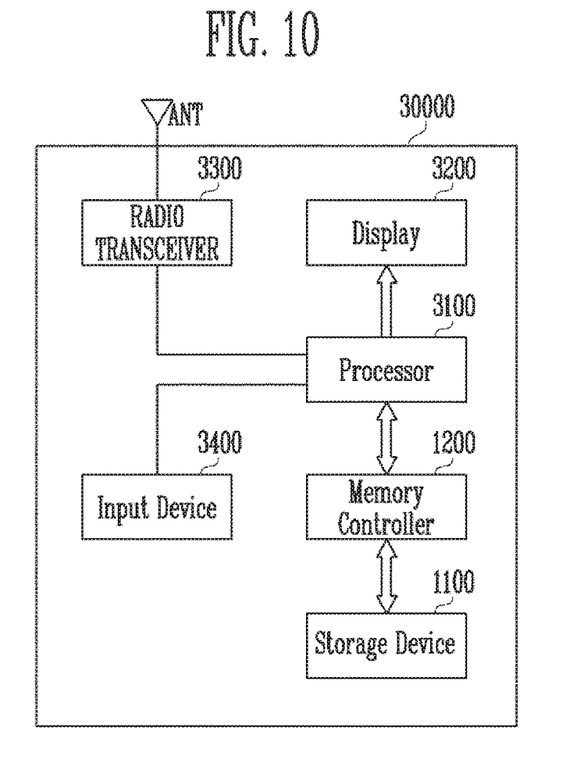
FIG. 10 is a diagram illustrating another embodiment of a memory system including a memory controller illustrated in FIG. 1.

FIG. 10 is a diagram illustrating another embodiment of a memory system 30000 including the memory controller 1200 illustrated in FIG. 1.

Referring to FIG. 10, the memory system 30000 may be embodied to a cellular phone, a smart phone, a tablet PC, a personal digital assistant (PDA), or a wireless communication device. The memory system 30000 may include the storage device 1100 and the memory controller 1200 to control operations of the storage device 1100. The memory controller 1200 may control data access operations of the storage device 1100 such as program, erase, and read operations in accordance with the control of a processor 3100.

The data programed in the storage device 1100 may be outputted through a display 3200 in response to the control of the memory controller 1200.

A radio transceiver 3300 may receive or transmit radio signals through an antenna ANT. For example, the radio transceiver 3300 may convert a radio signal received through the antenna ANT to a signal the processor 3100 processes. Therefore, the processor 3100 may process the signal output from the radio transceiver 3300 and transmit the processed signal to the memory controller 1200 or the display 3200. The memory controller 1200 may transmit the signal processed by the processor 3100 to the storage device 1100. The radio transceiver 3300 may convert the signal output from the processor 3100 to the radio signal, and may output the converted radio signal to an external device through the antenna ANT. An input device 3400 may input a control signal to control the operations of the processor 3100 or data to be processed by the processor 3100. The input device 3400 may be embodied to a pointing device such as a touch pad and a computer mouse, a keypad, or a keyboard. The processor 3100 may control the operations of the display 3200 so that the data output from the memory controller 1200, the data output from the radio transceiver 3300, and the data output from the input device 3400 may be outputted on the display 3200.

According to the embodiment, the memory controller 1200 which controls the operations of the storage device 1100 may be formed as a portion of the processor 3100, or a separate chip from the processor 3100.

Figure 11:
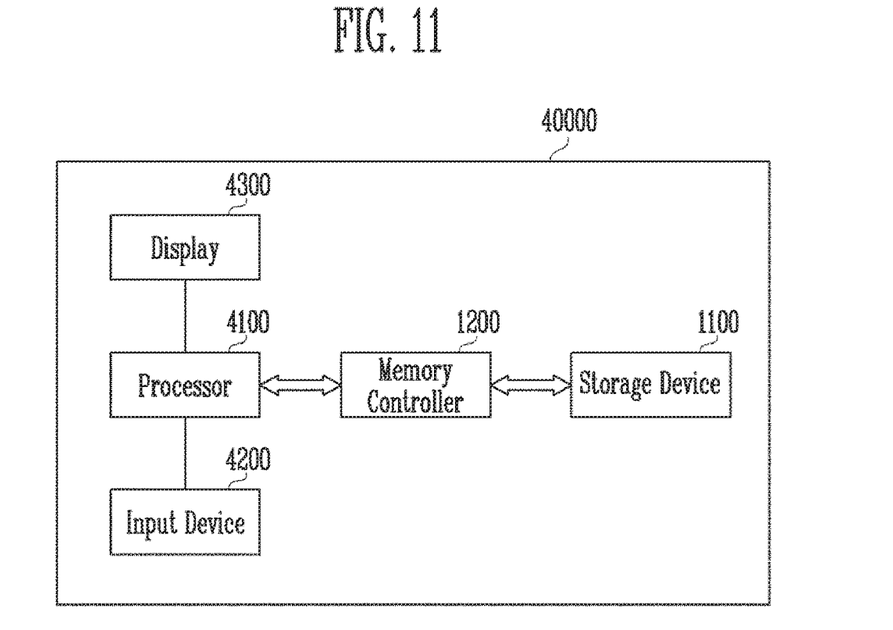
FIG. 11 is a diagram illustrating another embodiment of a memory system including the memory controller illustrated in FIG. 1.

FIG. 11 is a diagram illustrating another embodiment of a memory system 40000 including the memory controller 1200 illustrated in FIG. 1.

Referring to FIG. 11, the memory system 40000 may be embodied to a personal computer (PC), a tablet PC, a net-book, an e-reader, a personal digital assistant (PDA), a portable multimedia player (PMP), an MP3 player, or an MP4 player.

The memory system 40000 may include the storage device 1100 and the memory controller 1200 to control a data processing operation of the storage device 1100.

The processor 4100 may output the data stored in the storage device 1100 depending on the data input by an input device 4200, on a display 4300. For example, the input device 4200 may be embodied to a pointing device such as a touch pad and a computer mouse, a keypad, and a keyboard.

The processor 4100 may control the overall operation of the memory system 40000 and the operations of the memory controller 1200. According to the embodiment, the memory controller 1200 to control the operation of the storage device 1100 may be formed as a portion of the processor 4100 or a separate chip from the processor 4100.

Figure 12:
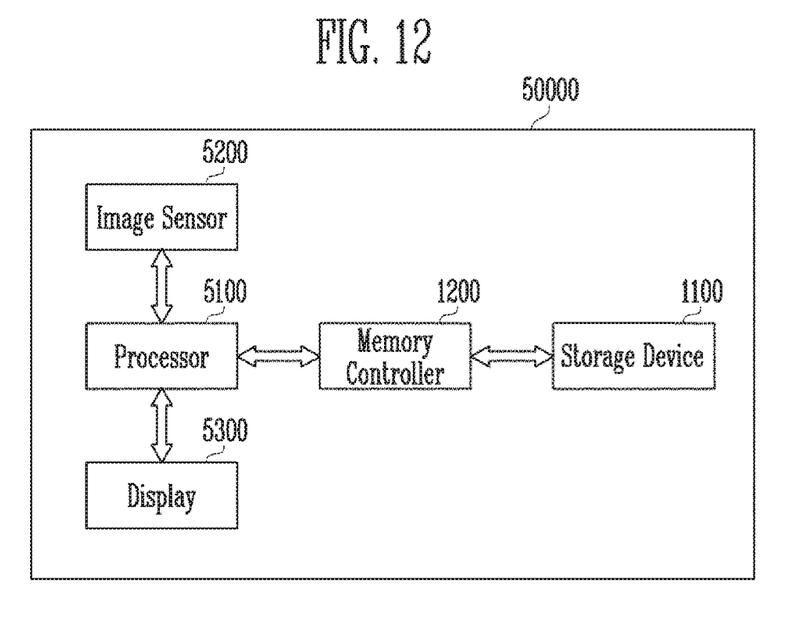
FIG. 12 is a diagram illustrating another embodiment of the memory system including the memory controller illustrated in FIG. 1.

FIG. 12 is a diagram illustrating another embodiment of a memory system 50000 including the memory controller 1200 illustrated in FIG. 1.

Referring to FIG. 12, the memory system 50000 may be embodied to an image processing device such as a digital camera, a cellular phone with a digital camera, a smartphone with a digital camera, or a tablet PC with a digital camera.

The memory system 50000 may include the storage device 1100 and the memory controller 1200 to control data processing operations of the storage device 1100, such as program, erase and read operations.

An image sensor 5200 of the memory system 50000 may convert an optical image to digital signals, and the converted digital signals may be transmitted to a processor 5100 or the memory controller 1200. In response to the control of the processor 5100, the converted digital signals may be outputted on a display 5300 or may be stored in the storage device 1100 through the memory controller 1200. The data stored in the storage device 1100 may be outputted on the display 5300 in response to the control of the processor 5100 or the memory controller 1200.

According to an embodiment, the memory controller 1200 for controlling the operation of the storage device 1100 may be formed as a portion of the processor 5100 or a separate chip from the processor 5100.

Figure 13:
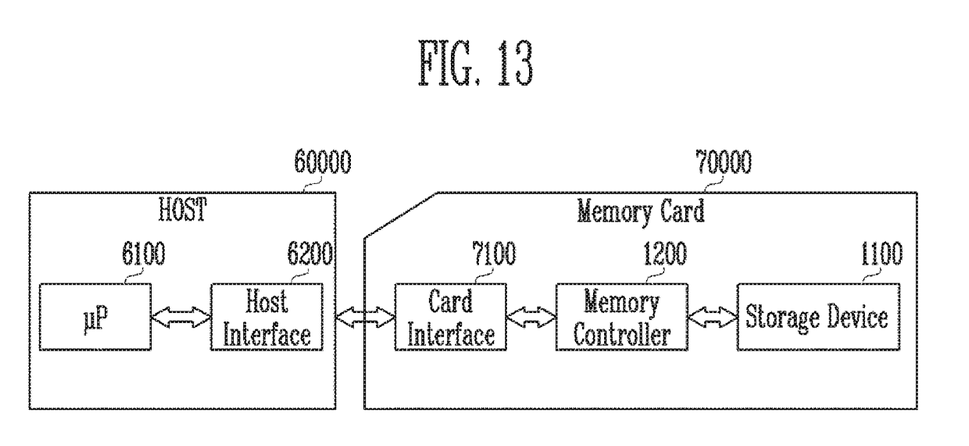
FIG. 13 is a diagram illustrating another embodiment of a memory system including the memory controller illustrated in FIG. 1.

FIG. 13 is a diagram illustrating another embodiment of a memory system 70000 including the memory controller 1200 illustrated in FIG. 1.

Referring to FIG. 13, the memory system 70000 may be embodied to a memory card or a smart card. The memory system 70000 may include the storage device 1100, the memory controller 1200, and a card interface 7100.

The memory controller 1200 may control an exchange of data between the storage device 1100 and the card interface 7100. According to the embodiment, the card interface 7100 may be a secure digital (SD) card interface or a multi-media card (MMC) interface, but may not be limited to these interfaces.

The card interface 7100 may interface with a data exchange between a host 60000 and the memory controller 1200 in response to a protocol of the host 60000. According to the embodiment, the card interface 7100 may support a universal serial bus (USB) protocol and an interchip (IC)-USB protocol. The card interface 7100 may be hardware which supports the protocol that the host 60000 uses, software mounted on the hardware, or a signal transmission method.

When the memory system 70000 accesses a host interface 6200 of the host 60000 such as a PC, a tablet PC, a digital camera, a digital audio player, a cellular phone, a console video game hardware, or a digital set-top box, the host interface 6200 may perform data communication with the storage device 1100 through the card interface 7100 and the memory controller 1200 in response to the control of a microprocessor (μP) 6100.

As described above, according to the present disclosure, a memory controller may support various storage devices by controlling fuse data.

Examples of embodiments have been disclosed herein, and although specific terms are employed, various changes in forms and details may be made to the above-described examples of embodiments without departing from the spirit and scope of the present invention. Accordingly, it will be understood by those skilled in the art that the scope of the present invention should not be limited to the above-described examples of embodiments, and may cover the scope of the following claims and their equivalents.

What is claimed is:

1. A memory controller for controlling a storage device, comprising:
a read only memory (ROM) configured to store a plurality of fuse data relating to a plurality of storage devices and output a ROM code corresponding to target fuse data in response to a return of power to the ROM after power interruption or turn off, wherein the target fuse data relating to the storage device is selected from among the plurality of fuse data when an enable signal is provided to the ROM; and
a control processor configured to execute firmware corresponding to the ROM code,
wherein the ROM comprises:
a fuse memory configured to store the plurality of fuse data and output the target fuse data; and
a ROM code register configured to output the ROM code corresponding to firmware information included in the target fuse data, and
wherein the control processor performs an error correction operation using a low density parity check code rate determined by the firmware information.

2. The memory controller of claim 1, wherein each of the plurality of fuse data further includes a wafer number, a lot number, and a packaging date.

3. The memory controller of claim 1, wherein the ROM code register stores one or more ROM codes to execute various firmware.

4. The memory controller of claim 1, further comprising:
an internal memory configured to store an address map table for mapping logical and physical addresses;
a memory interface configured to exchange a command, an address and data between the memory controller and the storage device;
a buffer memory configured to temporarily store data during an operation of the memory controller; and
a host interface configured to exchange a command, an address and data between the memory controller and a host.

5. The memory controller of claim 1, wherein each of the plurality of fuse data is set up by setting an e-fuse.

6. The memory controller of claim 5, wherein the e-fuse is set during a packaging process and is set differently depending on each of the plurality of storage devices.

7. A memory system, comprising:
a storage device configured to store data; and
a memory controller configured to generate a ROM code to execute various types of firmware depending on a fuse setting and to execute the firmware depending on the ROM code,
wherein the memory controller comprises:
a ROM configured to store a plurality of fuse data relating to a plurality of storage devices and output the ROM code corresponding to target fuse data in response to a return of power to the ROM after power interruption or turn off, wherein the target fuse data relating to the storage device is selected from among the plurality of fuse data when an enable signal is provided to the ROM, and
a control processor configured to execute the firmware corresponding to the ROM code,
wherein the ROM comprises:
a fuse memory configured to store the plurality of fuse data and output the target fuse data by the fuse setting; and
a ROM code register configured to output the ROM code corresponding to firmware information included in the target fuse data, and
wherein the control processor performs an error correction operation using a low density parity check code rate determined by the firmware information.

8. The memory system of claim 7, wherein the ROM code is revised by changing the fuse setting when the storage device is changed.

9. The memory system of claim 7, wherein the memory controller further comprises:
an internal memory configured to store an address map table for mapping logical and physical addresses;
a memory interface configured to exchange a command, an address and data between the memory controller and the storage device;
a buffer memory configured to temporarily store data during an operation of the memory controller; and
a host interface configured to exchange a command, an address and data between the memory controller and a host.

10. The memory system of claim 9, wherein each of the plurality of fuse data further includes a wafer number, a lot number, and a packaging date.

11. The memory system of claim 9, wherein the ROM code register stores ROM codes to execute various firmware.

12. A memory system comprising:
   a memory device;
   a read only memory (ROM) configured to store a plurality of fuse data relating to a plurality of storage devices and ROM code and output the ROM code corresponding to target fuse data in response to a return of power to the ROM after power interruption or turn off, wherein the target fuse data relating to the storage device is selected from among the plurality of fuse data when an enable signal is provided to the ROM; and
   a control processor configured to execute firmware according to the ROM code thereby controlling the memory device,
   wherein the ROM comprises:
   a fuse memory configured to store the plurality of fuse data and output the target fuse data in response to the power voltage; and
   a ROM code register configured to output the ROM code corresponding to firmware information included in the target fuse data, and
   wherein the control processor performs an error correction operation using a low density parity check code rate determined by the firmware information.

13. The memory system of claim 12, wherein the ROM provides the control processor with the ROM code through the target fuse data dependent upon the memory device and set by an e-fuse.

* * * * *

UNITED STATES PATENT AND TRADEMARK OFFICE
CERTIFICATE OF CORRECTION

| | | |
|---|---|---|
| PATENT NO. | : 11,281,385 B2 | Page 1 of 1 |
| APPLICATION NO. | : 15/980389 | |
| DATED | : March 22, 2022 | |
| INVENTOR(S) | : Kim | |

It is certified that error appears in the above-identified patent and that said Letters Patent is hereby corrected as shown below:

On the Title Page

Item [54], and in the Specification Column 1 Line 1 change the title as follows:
MEMORY CONTROLLER FOR CONTROLLING ROM CODE AND MEMORY SYSTEM FOR EMPLOYING THE MEMORY CONTROLLER Signed and Sealed this
Tenth Day of May, 2022

*Katherine Kelly Vidal*

Katherine Kelly Vidal
*Director of the United States Patent and Trademark Office*